(12) United States Patent
Hollatz et al.

(10) Patent No.: US 7,030,017 B2
(45) Date of Patent: Apr. 18, 2006

(54) METHOD FOR THE PLANARIZATION OF A SEMICONDUCTOR STRUCTURE

(75) Inventors: Mark Hollatz, Neustadt (DE); Klaus-Dieter Morhard, Dresden (DE); Alexander Trüby, Dresden (DE); Dirk Többen, Munich (DE)

(73) Assignee: Infineon Technologies AG, Munich (DE)

( * ) Notice: Subject to any disclaimer, the term of this patent is extended or adjusted under 35 U.S.C. 154(b) by 158 days.

(21) Appl. No.: 10/692,234

(22) Filed: Oct. 23, 2003

(65) Prior Publication Data

US 2004/0127040 A1   Jul. 1, 2004

Related U.S. Application Data

(63) Continuation of application No. PCT/EP02/05253, filed on May 13, 2002.

(30) Foreign Application Priority Data

May 15, 2001   (DE) ................ 101 23 509

(51) Int. Cl.
*H01L 21/302* (2006.01)
(52) U.S. Cl. .............. 438/691; 438/424; 438/692; 438/700
(58) Field of Classification Search ............ 438/691, 438/692, 697, 700, 703, 424, 426
See application file for complete search history.

(56) References Cited

U.S. PATENT DOCUMENTS

| 5,015,602 A | | 5/1991 | Van Der Plas et al. |
| 5,420,067 A | * | 5/1995 | Hsu ............... 438/700 |
| 5,874,345 A | | 2/1999 | Coronel et al. |
| 5,911,110 A | | 6/1999 | Yu |
| 6,025,270 A | | 2/2000 | Yoo |
| 6,043,133 A | * | 3/2000 | Jang et al. ............ 438/401 |
| 6,169,012 B1 | | 1/2001 | Chen et al. |

FOREIGN PATENT DOCUMENTS

| EP | 0 875 927 A2 | 11/1998 |
| JP | 2000-216236 | 8/2000 |

* cited by examiner

*Primary Examiner*—Lan Vinh
(74) *Attorney, Agent, or Firm*—Jenkins, Wilson & Taylor, P.A.

(57) ABSTRACT

The invention relates to a method for the planarization of a semiconductor structure comprising a substrate, in which several sub-structures (STI; AA; AA'; AA'';) are provided. said sub-structures (STI; AA; AA'; AA'',) having a first sub-structure (AA') with planar regions (PS) and first trench regions (DT). A layer to be planarized is applied over the semiconductor structure, said layer having appropriate recesses above the first trench regions (DT) of the first sub-structure (AA'). The method comprises the following steps: pre-planarization of the layer to be planarized by an etching step, using a pre-planarization mask, then subsequent planarization of the layer to be planarized by a chemical-mechanical polishing step. According to the invention, a first region (B1) is formed on the layer to be planarized above the first sub-structure (AA') by means of the pre-planarization mask, said region having a predetermined grid of masked and unmasked sections (M1; O1) are arranged in such a way that they respectively cover both first trench regions (DT) and planar regions (PS), and a supporting structure for the chemical-mechanical polishing step, which corresponds with the masked sections (M1) of the grid, is created by the etching step, using the pre-planarization mask.

7 Claims, 4 Drawing Sheets

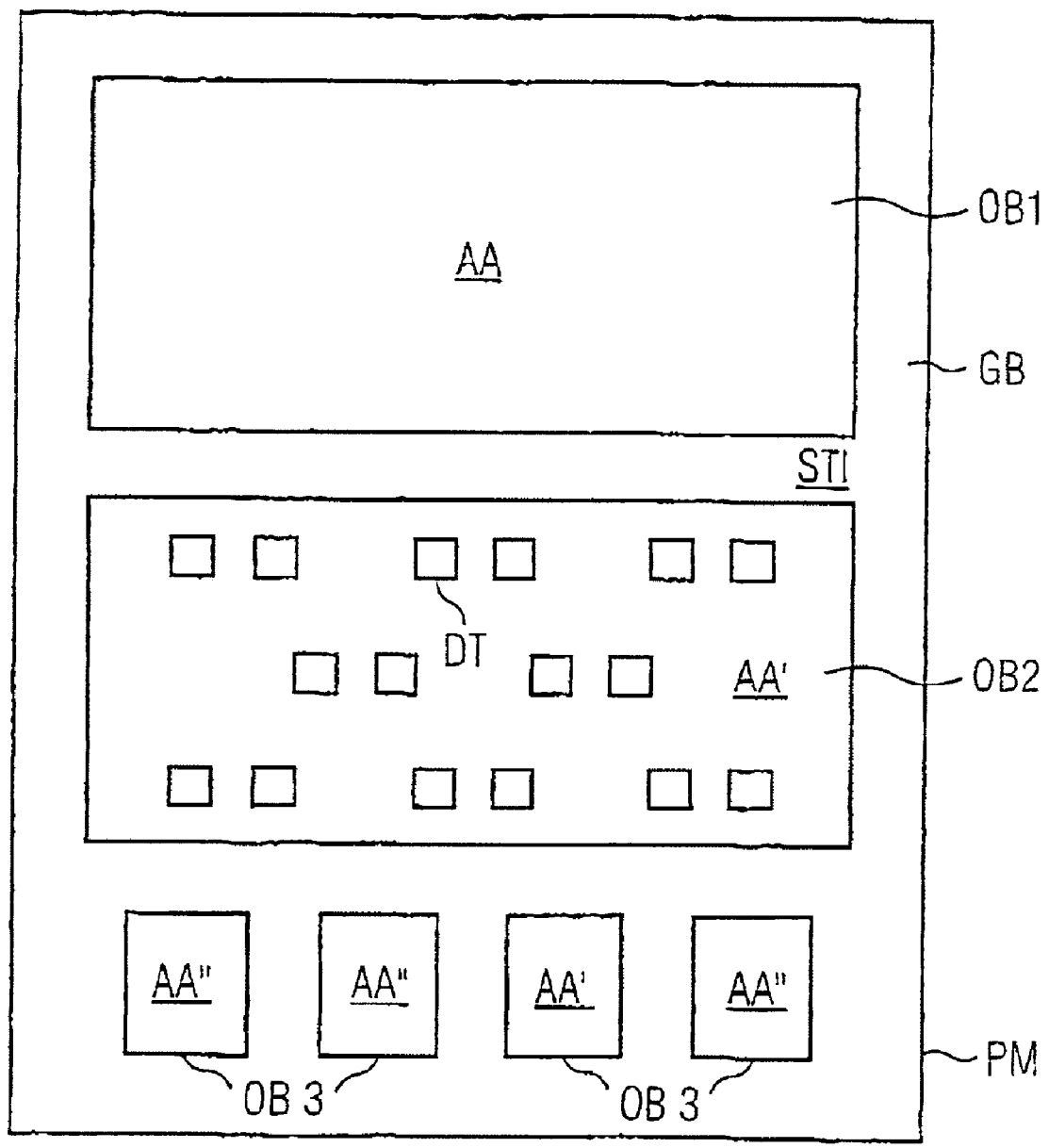

METHOD FOR THE PLANARIZATION OF A SEMICONDUCTOR STRUCTURE

RELATED APPLICATIONS

This application is a continuation of PCT patent application number PCT/EP02/05253, filed May 13, 2002, which claims priority to German patent application number 10123509.7, filed May 15, 2001, the disclosures of each of which are incorporated herein by reference in their entirety.

TECHINCAL FIELD

The present invention relates to a method in accordance with the preamble of claim 1, as known from U.S. Pat. No. 6,025,270.

A further planarization method is known from U.S. Pat. No. 5,015,602.

BACKGROUND ART

The term substrate is to be understood in the general sense and may therefore encompass both monolayer and multilayer substrates of any desired type.

Although applicable to any desired semiconductor components, the present invention and the problem area on which it is based are explained with regard to dynamic random access memories (DRAMs) in silicon technology.

So-called one-transistor cells are used in dynamic random access memories (DRAMs). Said cells comprise a storage capacitor and a selection transistor (MOSFET), which connects the storage electrode to the bit line.

The storage capacitor is usually designed as a trench capacitor in the new memory generations. In particular, so-called STI (Shallow Trench Isolation) trenches are provided on the corresponding semiconductor memory chips, which trenches isolate different active regions from one another.

FIGS. 3a–c show the essential process stages of a method for the planarization of a semiconductor structure.

In FIG. 3a, reference symbol 1 designates a silicon semiconductor substrate into which capacitor trenches DT and shallow trench isolation trenches STI are introduced. The capacitor trenches DT are filled in a known manner with corresponding filling materials DFT, e.g. electrodes and dielectrics. Situated on the surface of the substrate 1 is a patterned hard mask HM, which has been opened at the locations of the capacitor trenches DT and isolation trenches STI. A TEOS oxide layer HDP to be planarized, which has depressions V1 and V2 at the locations of the trenches DT and STI, respectively, is provided over the resulting structure.

Firstly a preplanarization is carried out on this semiconductor structure. During this preplanarization, a preplanarization mask made of photoresist (not shown) is applied to the semiconductor structure by means of a photomask PM. In the known planarization method, the photomask PM contains open regions o above the capacitor trenches DT and above the planar periphery thereof and also closed regions c above the isolation trenches STI and the directly adjoining periphery thereof. If the structure of the photomask PM is then transferred to the photoresist (not shown) on the semiconductor structure by exposure, then, in the case of positive resist, a masking results at the locations of the closed regions c and a nonmasking results at the locations of the open regions o after the photoresist has been developed.

Afterward, the regions of the semiconductor structure which have been freed of the photoresist are etched selectively with respect to the masked regions, preferably by means of a dry etching method, which leads to the structure shown in FIG. 3b. During this dry etching step, it must be taken into consideration that residues of the TEOS oxide layer HDP still remain on the hard mask HM. The protection of the photoresist mask means that supporting regions SB remain in the periphery of the STI trenches, which supporting regions serve for avoiding a dishing effect in the isolation trenches STI if a chemical mechanical polishing step is subsequently carried out.

FIG. 3c shows the result of the planarization after said chemical mechanical polishing step. Said supporting structures SB prevent the dishing effect at the isolation trenches STI, as indicated by the planar surface. However, at the capacitor trenches DT, the pad nitride of the hard mask HM is attacked at the locations DE, which results in a very high degree of nonuniformity of the step height. These step height differences may extend up to 100 µm into adjacent regions.

FIG. 4 shows a known photomask which is used in the method for the planarization of a semiconductor structure in accordance with FIGS. 3a–c.

FIG. 4 illustrates, in particular, a plan view of the photomask PM in accordance with FIG. 3a. The photomask PM has a first open region OB1 corresponding to a first active region AA, no capacitor trenches DT being provided in the active region AA. During the preplanarization etching, the TEOS oxide layer is etched back in said open region OB1.

Furthermore, the photomask PM has a second open region OB2 corresponding to a second active region AA', the second active region AA' having capacitor trenches DT. This region is shown in partial fashion in FIGS. 3a to c.

Furthermore, the photomask PM has third open regions OB3 corresponding to further active regions AA", which likewise comprise no capacitor trenches DT.

Finally, the photomask PM has a closed frame region GB, at which the underlying photoresist is not exposed. This closed region covers the isolation trenches STI in an overlapping manner in order thus to enable the formation of the supporting structures SB (cf. FIG. 3b) which can prevent the dishing effect in the isolation trenches STI.

This photomask PM has hitherto been generated by a computational algorithm which searches for active regions, such as e.g. AA, AA', AA", that is to say for non-STI regions which are larger than a predetermined limit value, typically a few µm$^2$, and defines corresponding mask openings for them.

As stated, that entails the disadvantage of the dishing effect in the capacitor trenches DT, since these are not taken into account in the customary method. Moreover, it would be too laborious from the standpoint of the algorithm for each individual capacitor trench DT to be detected separately and provided with a corresponding supporting region.

SUMMARY OF THE INVENTION

The object of the present invention is to specify an improved method for the planarization of a semiconductor structure of the type mentioned in the introduction, it being possible to effectively prevent dishing in mixed structures with trenches and planar regions.

According to the invention, this object is achieved by means of the method for the planarization of a semiconductor structure which is specified in claim 1.

The general idea on which the present invention is based consists in the fact that by means of the preplanarization mask provision is made of a first region on the layer to be planarized above the first substructure, which region has a predetermined grid of masked and nonmasked sections; the masked and nonmasked sections being arranged in such a way that they respectively cover both first trench regions and planar regions; and a supporting structure for the chemical mechanical polishing step, which corresponds to the masked sections of the grid, being created by the etching step using the preplanarization mask.

Wherever planar active regions and trench structures occur in a closely adjacent manner, a grid with suitable holes is placed over the structure. Consequently, unlike the case hitherto, the corresponding active region with planar structures and trench structures is not opened completely, but rather only in grid form. In other words, in the preplanarization etching step, rather than the entire TEOS oxide volume being etched back, only a proportion of typically 50% which has been opened is etched back. The consequence is that now the larger oxide volume acts as supporting layer and a dishing effect can be avoided in said active regions as well.

The planarization method according to the invention makes it possible to avoid dishing effects in particular in active regions with capacitor trenches. The consequence is an improved uniformity of the step heights, which manifests itself in improved transistor performance and reduced susceptibility to gate contact short circuits and to excessively high contact hole resistances.

According to the invention, the substructures have a second substructure, which comprises second trench regions, the layer to be planarized having corresponding second depressions above the second trench regions of the second substructure, and in that, by means of the preplanarization mask, provision is made of a second region on the layer to be planarized above the second substructure, which region is masked throughout.

Advantageous developments and improvements of the subject matter of the invention are found in the subclaims.

In accordance with one preferred development, the second region extends beyond the second trench regions into adjoining substructures.

In accordance with a further preferred development, the substructures have third substructures, which comprise planar regions, and in that, by means of the preplanarization mask, provision is made of third regions on the layer to be planarized above the third substructures, which regions are nonmasked throughout.

In accordance with a further preferred development, the preplanarization mask is fabricated lithographically by means of a corresponding photomask on the semiconductor structure.

In accordance with a further preferred development, the grid has a preferably regular hole structure.

In accordance with a further preferred development, the grid has a preferably regular strip structure.

In accordance with a further preferred development, the grid has at least 50% nonmasked regions.

An exemplary embodiment of the invention is illustrated in the drawings and explained in more detail in the description below.

BRIEF DESCRIPTION OF THE DRAWINGS

In the figures:

FIG. 4 shows a known photomask which is used in the method for the planarization of a semiconductor structure in accordance with FIGS. 3a–c.

DETAILED DESCRIPTION OF THE INVENTION

In the figures, identical reference symbols designate identical or functionally identical elements.

Figure 1:
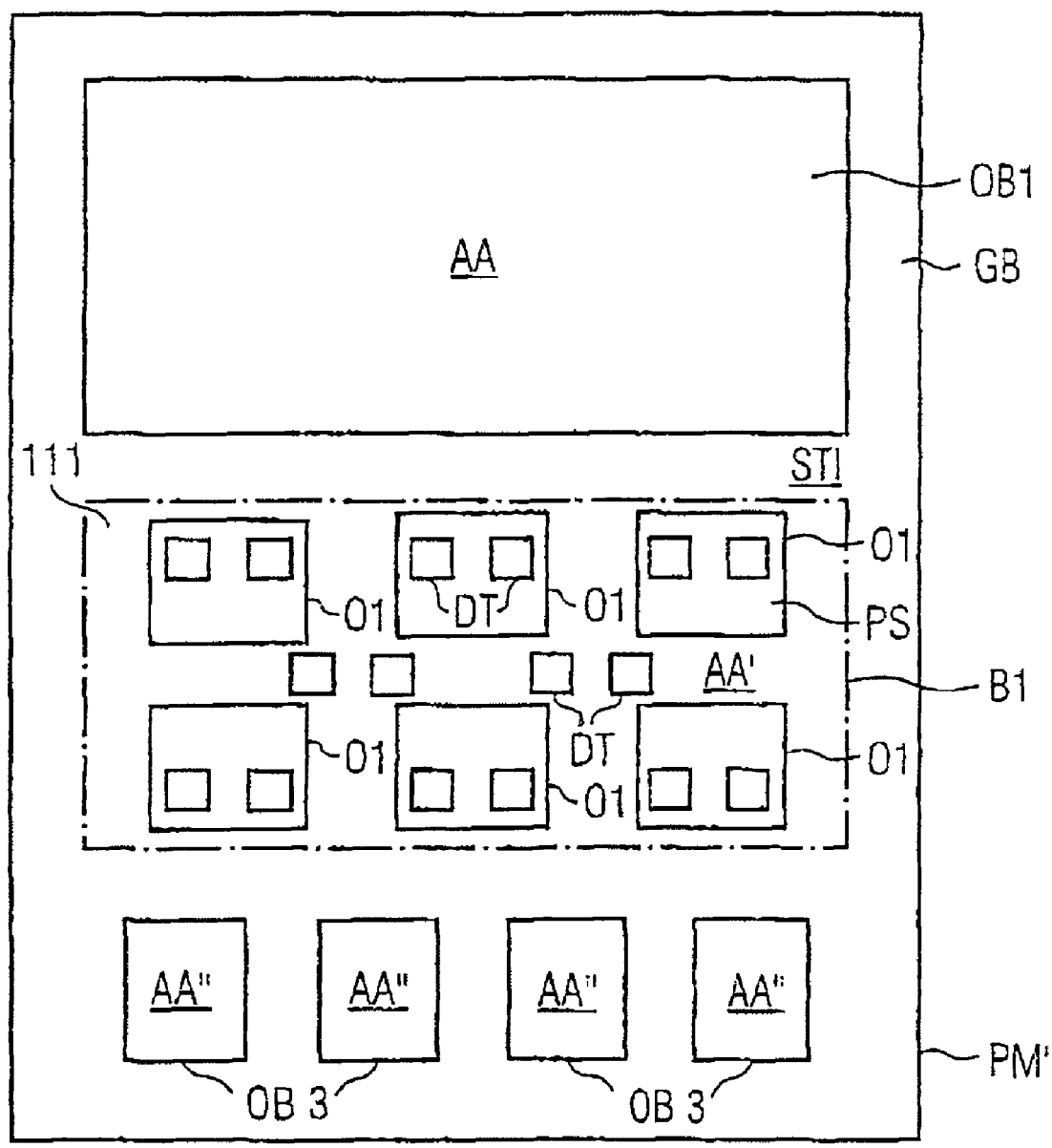
FIG. 1 shows a photomask for elucidating an exemplary embodiment of the method according to the invention.

FIG. 1 shows a photomask for elucidating an exemplary embodiment of the method according to the invention.

Figure 3A:
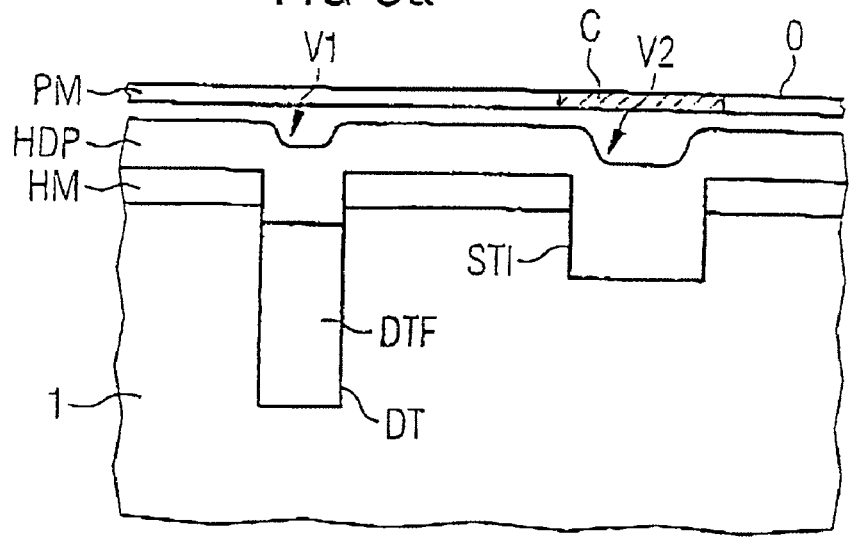
FIGS. 3a–c show the essential process stages of a method for the planarization of a semiconductor structure.

In the method according to the invention in accordance with the illustrated and described embodiment, the same method steps take place, in principle, as in the known planarization method which has been explained in detail with reference to FIGS. 3a to c.

Merely a different photomask PM' for producing the preplanarization mask made of photoresist is used for this purpose.

As illustrated in FIG. 1, the regions GB, OB1 and OB3 of the photomask PM' correspond to the known regions. Only within the active region AA', which has capacitor trenches DT and planar structures PS situated alongside, is the photomask PM' configured differently than in the prior art, where the photomask PM had been opened above the entire active region AA'.

In this embodiment of the invention, then, a region B1 of the photomask is provided above the active region AA', said region B1 having a predetermined regular grid of masked and nonmasked sections M1 and O1, respectively, in the form of squares. The masked and nonmasked sections M1 and O1, respectively, are arranged in such a way that they uniformly cover the region B1, and they respectively cover both trench regions DT and planar regions PS, that is to say are configured independently of the underlying structure.

Thus, a regular grid is placed over the active region AA', said grid creating additional supporting regions SB' (cf. FIG. 2), which prevent or reduce the dishing effect. In this case, however, the grid openings O1 do not correspond to the pattern of the underlying capacitor trenches DT, but rather have their own symmetry, the characteristic lengths of the grid openings O1 being greater than the characteristic structure lengths or structure diameters of the underlying capacitor trenches DT. This makes it possible to produce a supporting structure in a simplified manner.

Figure 2:
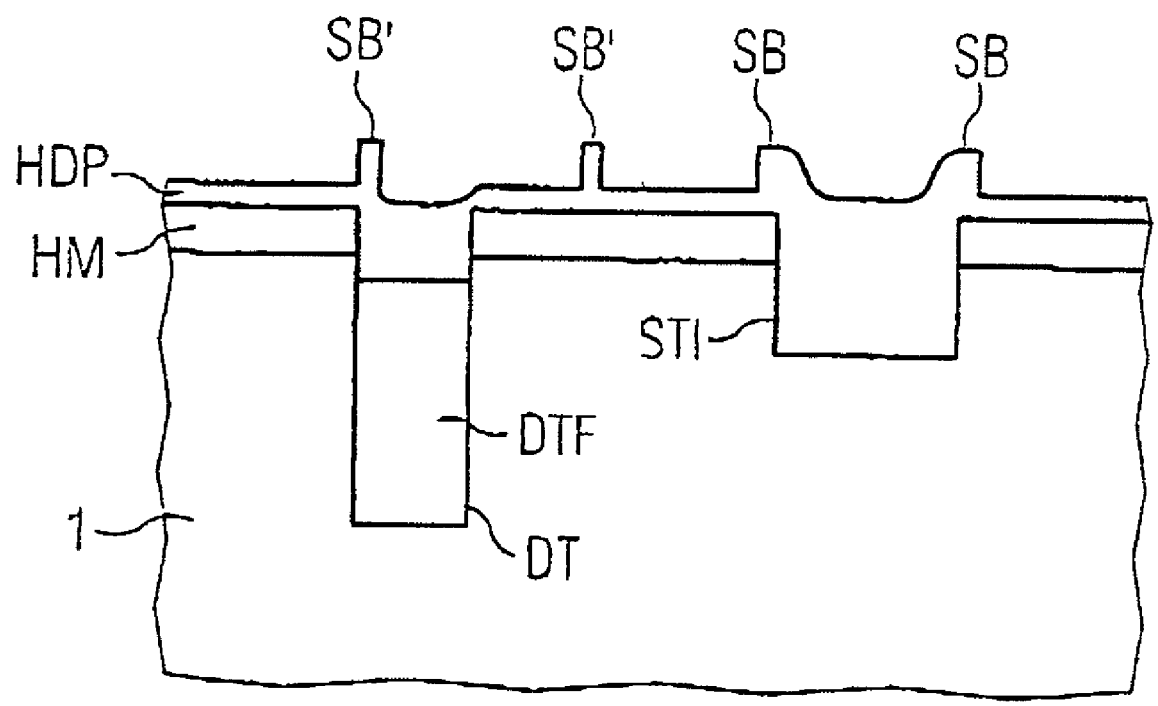
FIG. 2 shows a semiconductor structure after the preplanarization etching, which has been patterned beforehand by means of the photomask of FIG. 1.

FIG. 2 shows a semiconductor structure after the preplanarization etching, which has been patterned beforehand by means of the photomask of FIG. 1.

Figure 3B:
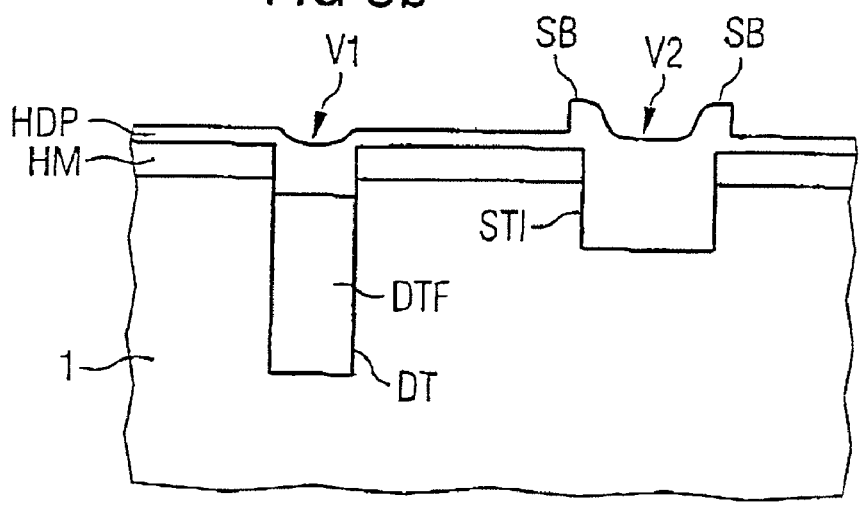
Figure 3C:
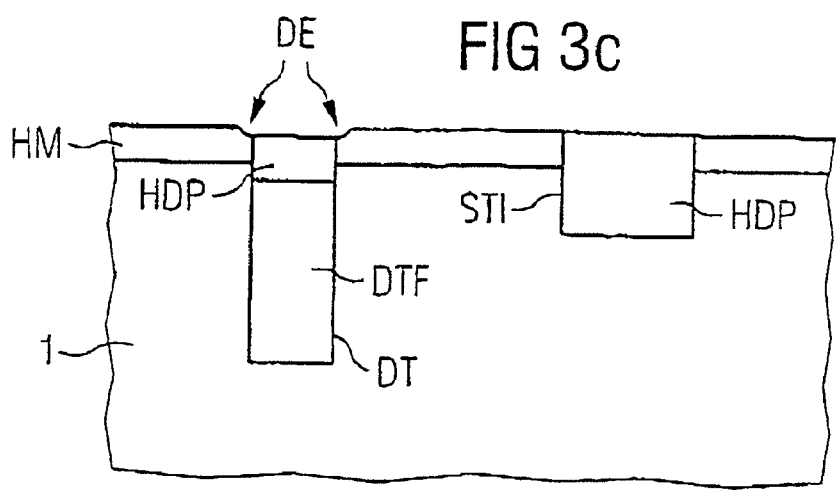

FIG. 2 shows the state of the corresponding semiconductor structure after the preplanarization etching has been carried out, which corresponds to the state illustrated in FIG. 3b. It can clearly be seen that the introduced grid creates, in the region B2, new additional supporting regions SB' which are arranged in the active region AA' both in the planar sections and above the capacitor trenches DT, which prevent dishing.

Although the present invention has been described above on the basis of a preferred exemplary embodiment, it is not restricted thereto, but rather can be modified in diverse ways.

In particular, the invention can be applied to any desired components and is not limited to dynamic random access memories (DRAMs) in silicon technology.

Besides a grid with holes to be opened, other grid patterns are also possible, in principle. They include strip structures, by way of example. What is important here is the pattern density which there has to be in certain regions, which are to be determined experimentally. In this case, the filling structures have to fulfill the same design rules as the other structures with regard to the minimum positioning relative to the edge of the relevant active regions.

LIST OF REFERENCE SYMBOLS

Method for the Planarization of a Semiconductor Structure

| | |
|---|---|
| AA, AA', AA'' | Active regions |
| STI | Isolation trenches |
| PM, PM' | Photomask |
| M1, c | Closed regions |
| O1, o | Open regions |
| B1 | First region |
| DT | Capacitor trenches |
| STI | Isolation trenches |
| GB | Closed region of photomask |
| SB, SB' | Supporting structure |
| HDP | TEOS oxide layer |
| HM | Hard mask |
| 1 | Substrate |
| V1, V2 | Depression |
| DTF | Trench filling |
| DE | Damaged HM due to dishing |
| OB1, OB2, OB3 | Open regions |

What is claimed is:

1. A method for the planarization of a semiconductor structure having a substrate, in which a plurality of substructures are provided, the substructures having a first substructure, which has planar regions and first trench regions, a layer to be planarized being applied over the semiconductor structure, which layer has corresponding first depressions above the first trench regions of the first substructure, the method comprising the following steps:
   (a) preplanarizing the layer to be planarized by an etching step using a preplanarization mask;
   (b) planarizing the layer to be planarized by a chemical mechanical polishing step;
   (c) by means of the preplanarization mask, provisioning a first region on the layer to be planarized above the first substructure, which region has a predetermined grid of masked and nonmasked sections;
   (d) arranging the masked and nonmasked sections in such a way that they respectively cover both first trench regions and planar regions;
   (e) creating a supporting structure for the chemical mechanical polishing step, which corresponds to the masked sections of the grid, by the etching step using the preplanarization mask;
   (f) wherein the substructures have a second substructure, which comprises second trench regions, the layer to be planarized having corresponding second depressions above the second trench regions of the second substructure, and in that, by means of the preplanarization mask, provision is made of a second region on the layer to be planarized above the second substructure, which region is masked throughout; wherein
      (i) the first trench regions are capacitor trenches;
      (ii) the second trench regions are STI trenches;
      (iii) a patterned hard mask is provided on the surface of the substrate, said hard mask being opened at the first trench regions and at the second trench regions;
      (iv) the grid of masked and nonmasked sections is a regular grid;
      (v) the arrangement of the nonmasked sections have a symmetry, the characteristic lengths of the nonmasked sections being a multiple of the characteristic structure lengths of the underlying first trench regions; and
      (vi) the subsequent planarization of the layer to be planarized is effected by a chemical mechanical polishing step as far as the surface of the hard mask.

2. The method as claimed in claim 1, wherein the second region extends beyond the second trench regions into adjoining substructures.

3. The method as claimed in claim 1, wherein the substructures have third substructures, which comprise planar regions, and in that, by means of the preplanarization mask, provision is made of third regions on the layer to be planarized above the third substructures, which regions are nonmasked throughout.

4. The method as claimed in claim 1, comprising fabricating the preplanarization mask lithographically by means of a corresponding photomask on the semiconductor structure.

5. The method as claimed in claim 1, wherein the grid has a preferably regular hole structure.

6. The method as claimed in claim 1, wherein the grid has a preferably regular strip structure.

7. The method as claimed in claim 1, wherein the grid has at least 50% nonmasked regions.

* * * * *